United States Patent [19]
Hasegawa

[11] Patent Number: 5,404,057
[45] Date of Patent: Apr. 4, 1995

[54] OUTPUT CIRCUIT FOR OUTPUTTING SIGNALS HAVING DIFFERENT LOGICAL AMPLITUDES

[75] Inventor: Takashi Hasegawa, Kawasaki, Japan

[73] Assignee: Fujitsu Limited, Kawasaki, Japan

[21] Appl. No.: 134,021

[22] Filed: Oct. 8, 1993

[30] Foreign Application Priority Data

Oct. 9, 1992 [JP] Japan .................................. 4-272083

[51] Int. Cl.6 .......................................... H03K 9/094
[52] U.S. Cl. ...................................... 326/63; 375/295; 326/21; 326/57; 326/121
[58] Field of Search ...................... 375/59, 24; 307/443, 307/451, 473, 475

[56] References Cited

U.S. PATENT DOCUMENTS

| | | | |
|---|---|---|---|
| 4,475,049 | 10/1984 | Smith et al. | 307/443 X |
| 4,567,385 | 1/1986 | Falater et al. | 307/443 |
| 4,656,373 | 4/1987 | Plus | 307/475 |
| 4,715,031 | 12/1987 | Crawford et al. | |
| 4,835,423 | 5/1989 | de Ferran et al. | 307/451 X |
| 4,859,870 | 8/1989 | Wong et al. | 307/451 X |
| 4,929,941 | 5/1990 | Lecocq | |
| 5,001,642 | 3/1991 | Botzenhardt et al. | |
| 5,300,828 | 4/1994 | McClure | 307/473 X |
| 5,300,835 | 4/1994 | Assar et al. | 307/475 |

Primary Examiner—David R. Hudspeth
Attorney, Agent, or Firm—Armstrong, Westerman, Hattori, McLeland & Naughton

[57] ABSTRACT

A semiconductor device having a driver circuit for outputting two kinds of signals of different logical amplitudes and a control circuit for switching the driver circuit. The driver circuit has MOS transistors which are connected in series, the source of one MOS transistor being connected to a power supply wire VCC/GND and the drain of the other MOS transistor being connected to an output terminal. The control circuit has a MOS transistor switch for turning on/off the connection between the gate and the drain of the other MOS transistor in accordance with a mode signal MODE, and another MOS transistor switch which turns on/off the connection between the gate of the MOS transistors.

13 Claims, 9 Drawing Sheets

Fig.1

WAKE-UP MODE

ORDINARY MODE

OUTPUT CIRCUIT FOR OUTPUTTING SIGNALS HAVING DIFFERENT LOGICAL AMPLITUDES

BACKGROUND OF THE INVENTION

1. Field of the Invention

The present invention relates to an output circuit for data transfer, which is capable of outputting binary logic signals having different logical amplitudes and applied to a semiconductor device.

2. Description of the Related Art

The current trend towards automotive electronics has brought about an increase in the number of electronic devices including the system controller and, hence, an increase in the number of electric wires to be laid between these electronic devices. To decrease the number of electric wires, the data between the electronic device are transmitted in a serial manner through a dual wires as disclosed in U.S. Pat. Nos. 4,715,031, 4,929,941 and 5,001,642.

Standardization of serial data transmission systems for use in automobiles has been worked out by the SAE (Society of Automotive Engineers of America) which classifies the serial data transmission system into three classes A to C according to the transmission speed required. Class A is for low-speed transmission under 125 Kbps and is applied to the device control systems in the body including lamps, power windows, and door locks. Class B is for medium-speed transmission and is applied to status information systems such as electronic meters, navigators and vehicle diagnosis apparatus. Class C is for high-speed transmission over 125 Kbps, and is applied to real-time control systems such as the engine control system, the brake control system and the transmission control system.

Figure 6:
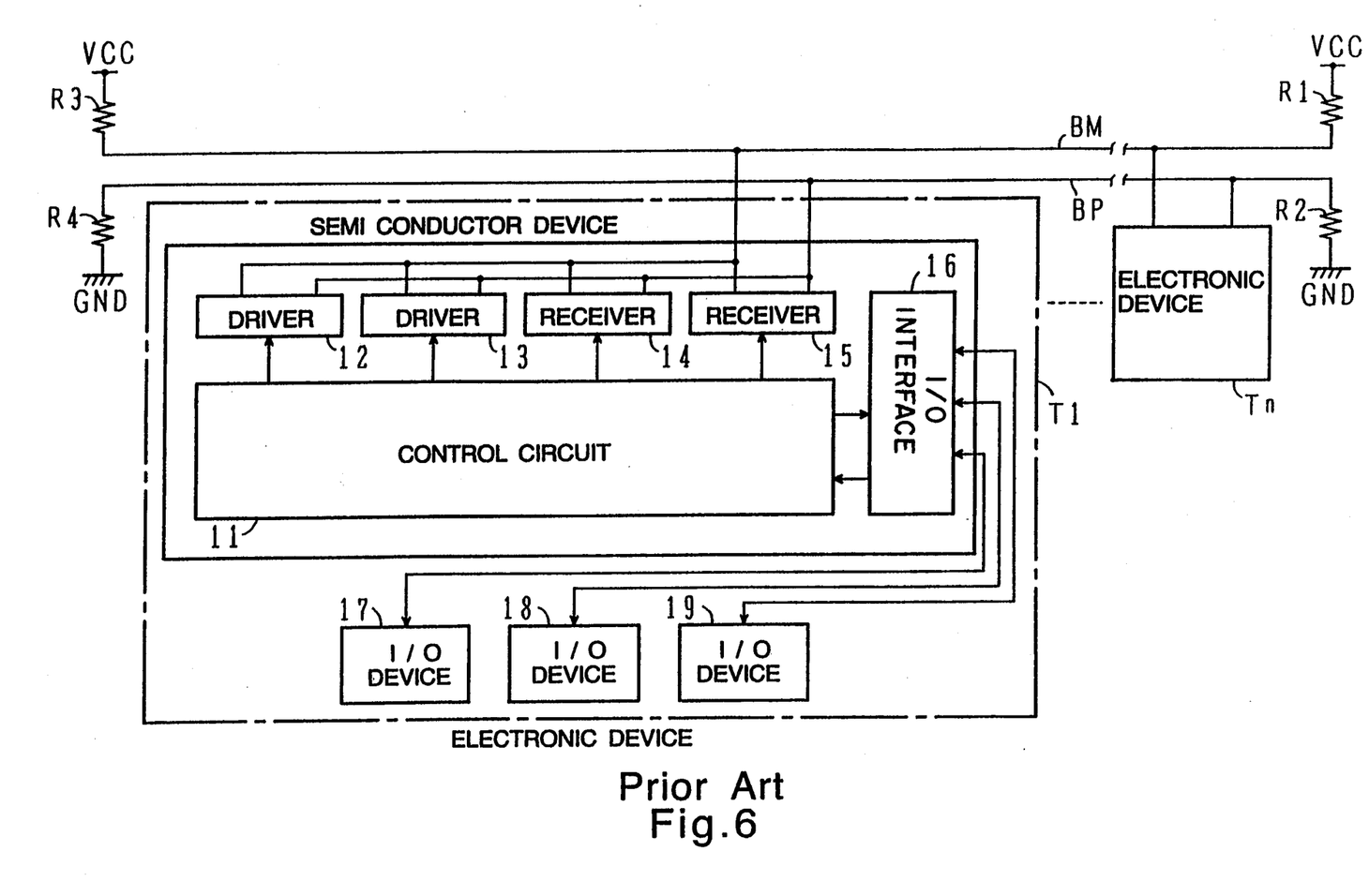
FIG. 6 is a schematic diagram showing connections between electronic devices and block diagram of a conventional semiconductor device in an electric device.

SAE also determines a standard J1850 as an Automotive LAN communication protocol covering the classes A to C. The physical layer of J1850 includes two types: one is a low-speed type while the other is a medium-speed type. The medium-speed type has a transmission rate of 41.6 Kbps, PWM (Pulse Width Modulation) form, dual-wire voltage drive method and use of wake-up signals, and has a connection form as shown in FIG. 6.

Figure 9A:
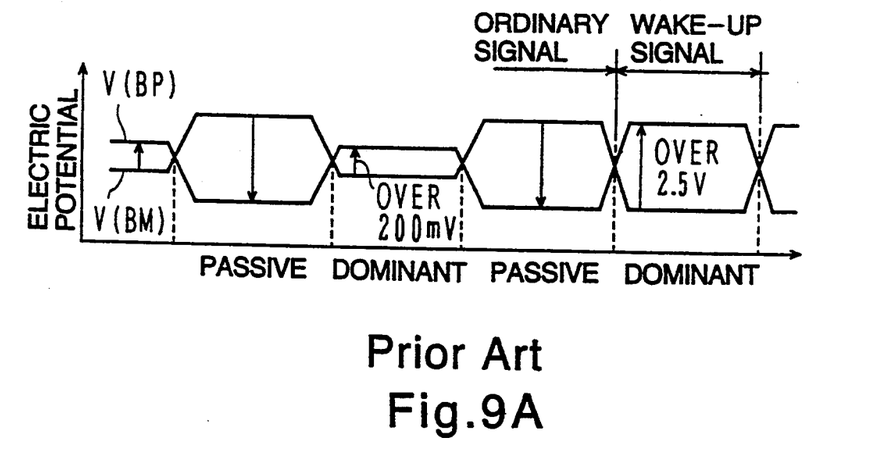
FIG. 9A is a wave amplitude chart of ordinary signal and wake-up signal used for transmissions between the electronic devices shown in FIG. 6.
Figure 9B:
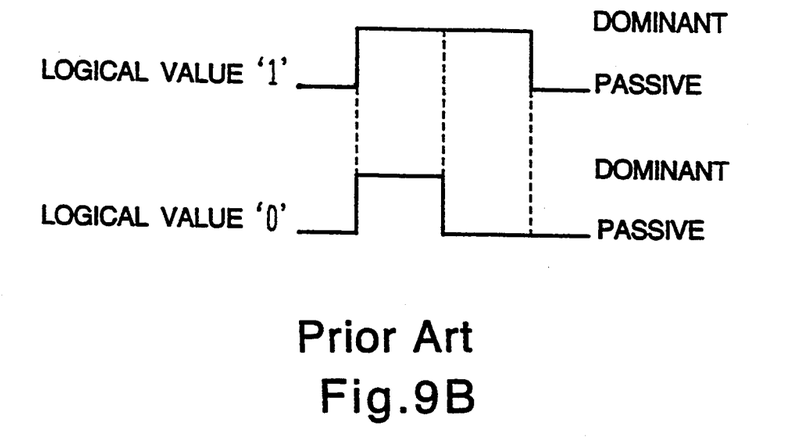
FIG. 9B is a wave form chart showing the relation between logical value and pulse width.

A couple of signal transmission wires BP and BM are used to connect n pieces of electronic devices T1 to Tn including system controller. The signal transmission wire BM is connected at one end through a resistor R1 to a power supply wire VCC and at the other end through a resistor R3, which value is equal to the value of the resistor R1, to the power supply wire VCC, while the signal transmission wire BP is connected at one end through a resistor R2 to a grounding wire GND and at the other end through a resistor R4, which value is equal to the value of the resistor R2, to the grounding wire GND. According to the dual-wire voltage drive method, the potentials V(BP) and V(BM) at the signal transmission wires BP and BM, respectively, vary in a manner shown in FIG. 9A for example. Normal signal voltage V(BP)-V(BM) has logical amplitude which is 200 mV or over at a dominant state, while wake-up signal voltage V(BP)-V(BM) has logical amplitude which is 2.5 V or over at a dominant state. The logical value "1" and "0" of ordinary signals are determined by pulse widths of the dominant state as shown in FIGS. 9B.

In order that two kinds of binary logic signals having different logical amplitudes are transmitted, a semiconductor device 10 is required to have a driver circuit 12 for ordinary signals and a driver circuit 13 for wake-up signals both of which are connected to a control circuit 11, as well as a receiver 14 for ordinary signals and a receiver 15 for wake-up signals both of which also are connected to the control circuit 11. The control circuit 11 performs local control of input/output devices 17 to 19 and receives status signals and other signals from these input/output devices, through an I/O interface 16.

Figure 7:
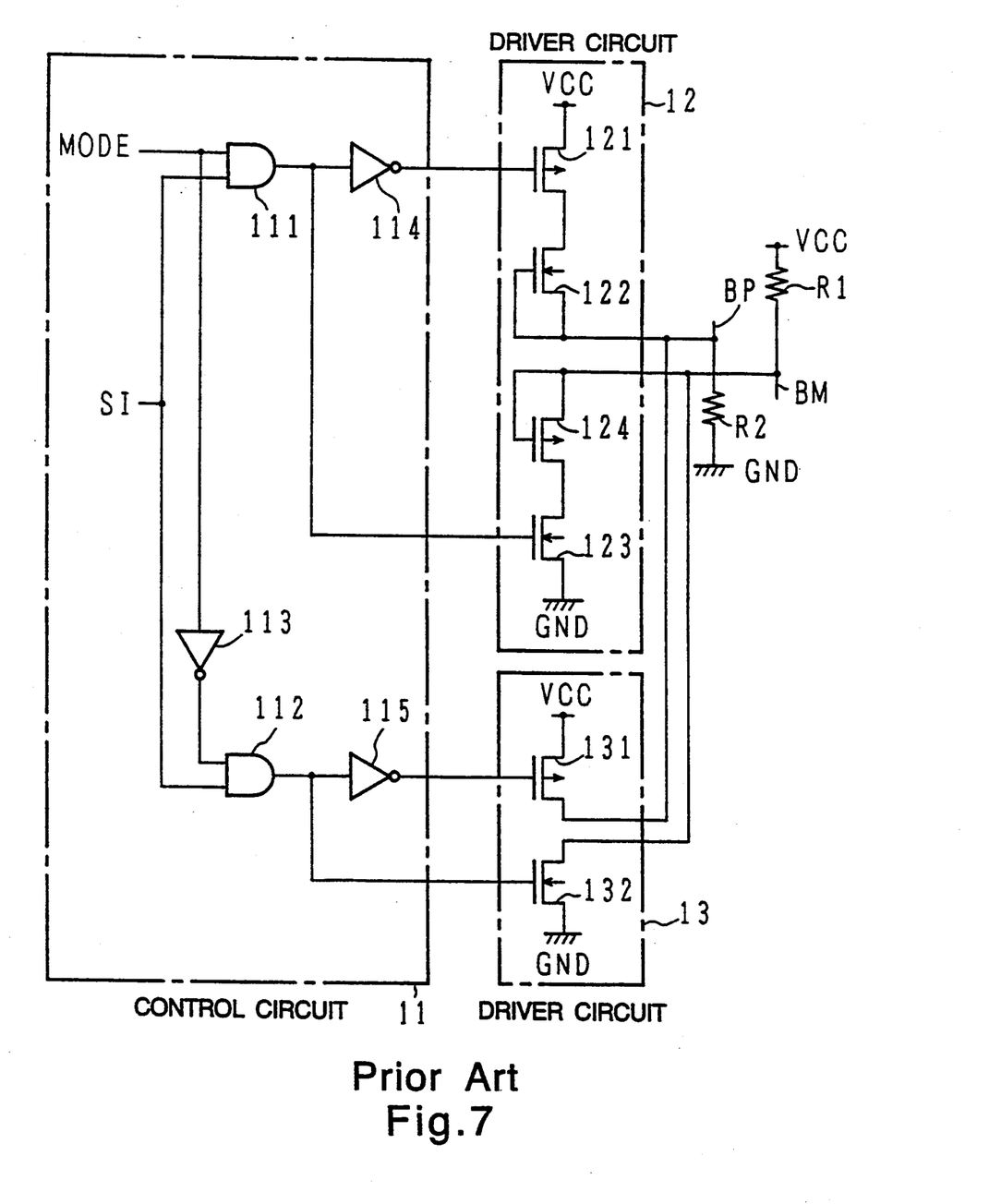
FIG. 7 is a diagram showing a conventional output circuit for outputting signals having different logical amplitudes consisting of two driver circuits and an output stage of a control circuit in the semiconductor device shown in FIG. 6.

FIG. 7 illustrates the construction of the output stage of the control circuit 11 having AND gates 111, 112 and inverters 113 to 115 and the constructions of the ordinary driver circuit 12 having pMOS transistors 121, 122 and nMOS transistors 123, 124 and the wake-up driver circuit 13 having a pMOS transistor 131 and an nMOS transistor 132.

When the mode signal is a high level so as to transmit an ordinary signal, the AND gate 112 is closed so that both the pMOS transistor 131 and the nMOS transistor 132 are kept in an off state. In this state, when the input signal SI shifts to high level, the pMOS transistor 121 turns on and the potential of the signal transmission wire BP raises from the ground level, while the nMOS transistor 123 turns on and the potential of the signal transmission wire BM falls down from the power supply voltage VCC. Conversely, when the input signal SI is shifted to low level, the pMOS transistor 121 turns off and the potential of the signal transmission wire BP falls down to the ground level, while the nMOS transistor 123 turns off and the potential of the signal transmission wire BM raises up to the power supply voltage VCC.

When the mode signal is of low level so as to transmit a wake up signal, the AND gate 111 is closed so that both the pMOS transistor 121 and the nMOS transistor 123 are kept in off state. In this state, when the the input signal SI is shifted to high level, the pMOS transistor 131 turns on and the potential of the signal transmission wire BP raises from the ground level, while the nMOS transistor 132 turns on and the the potential of the signal transmission wire BM falls from the power supply voltage VCC. Conversely, when the input signal SI is shifted to low level, the pMOS transistor 131 turns off and the potential of the signal transmission wire BP falls to the ground level, while the nMOS transistor 132 turns off and the the potential of the signal transmission wire BM raises to the power supply voltage VCC.

Figure 8:
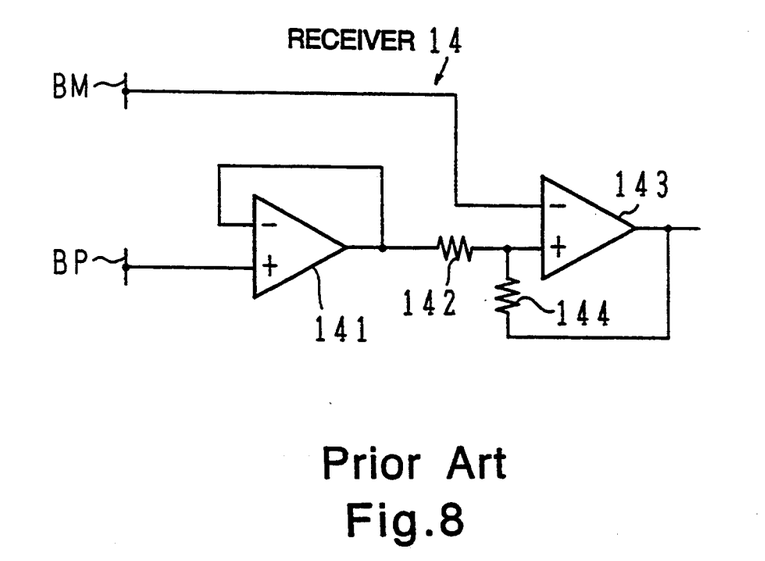
FIG. 8 is a conventional receiver circuit diagram in the semiconductor device shown in FIG. 6.

FIG. 8 illustrates the construction of the receiver 14 for ordinary signals. The receiver 14 has a voltage follower 141, the output node of which is connected through a resistor 142 to non-inversion input node of the operation amplifier 143, and a resistor 144 connected between the non-inversion input node of the operation amplifier 143 and the output node of the same. The operation amplifier 143, resistor 141 and resistor 144 compose a comparator having hysteresis. The output of the operation amplifier 143 becomes a high level only when the potential of the signal transmission wire BP is higher than that of the signal transmission wire BM by an amount which is determined by the resistors 142 and 144.

The wake-up receiver 15 has a construction which is the same as that shown in FIG. 8, except for the resistance values of the resistors 142, 144. This receiver 15 responds only to a wake-up signal and does not respond to ordinary signals. The wake-up signal puts into operation an electronic device, e.g., a back sonar whose operation has been slept.

It has thus been necessary to employ two different types of driver circuits, i.e., the driver circuit 12 for ordinary signals and the driver circuit 13 for wake-up signals. The area occupied by each of the pMOS transistors 121, 122, nMOS transistors 123, 124, pMOS transistor 131 and nMOS transistor 132 on chip has to be about 100 times larger than that of a MOS transistor in the control circuit 11, in order to obtain a sufficiently large driving power electric current of which is dozens of mA. Consequently, the chip size of the semiconductor device 10 becomes large.

SUMMARY OF THE INVENTION

In view of the aforementioned problem of the prior art, an object of the present invention is to reduce the chip size of a semiconductor device having a output circuit which outputs two kinds of signals of different logical amplitudes.

According to the first aspect of the present invention, there is provided an output circuit for outputting signals having different logical amplitude of voltage between a first output terminal and a second output terminal, comprising: a driving circuit having first and second MOS transistors connected in series between a first power supply line and the first output terminal; and third and fourth MOS transistors connected in series between a second power supply line and the second output terminal; and a control circuit for turning on/off the first to fourth MOS transistors in common in response to an input signal of binary logic when a mode signal is one state of binary logic and for turning on/off both of the first and third MOS transistors in common with short-circuiting between a gate and a drain of each the second and fourth MOS transistor in response to the input signal when the mode signal is the other state of the binary logic.

Figure 1:
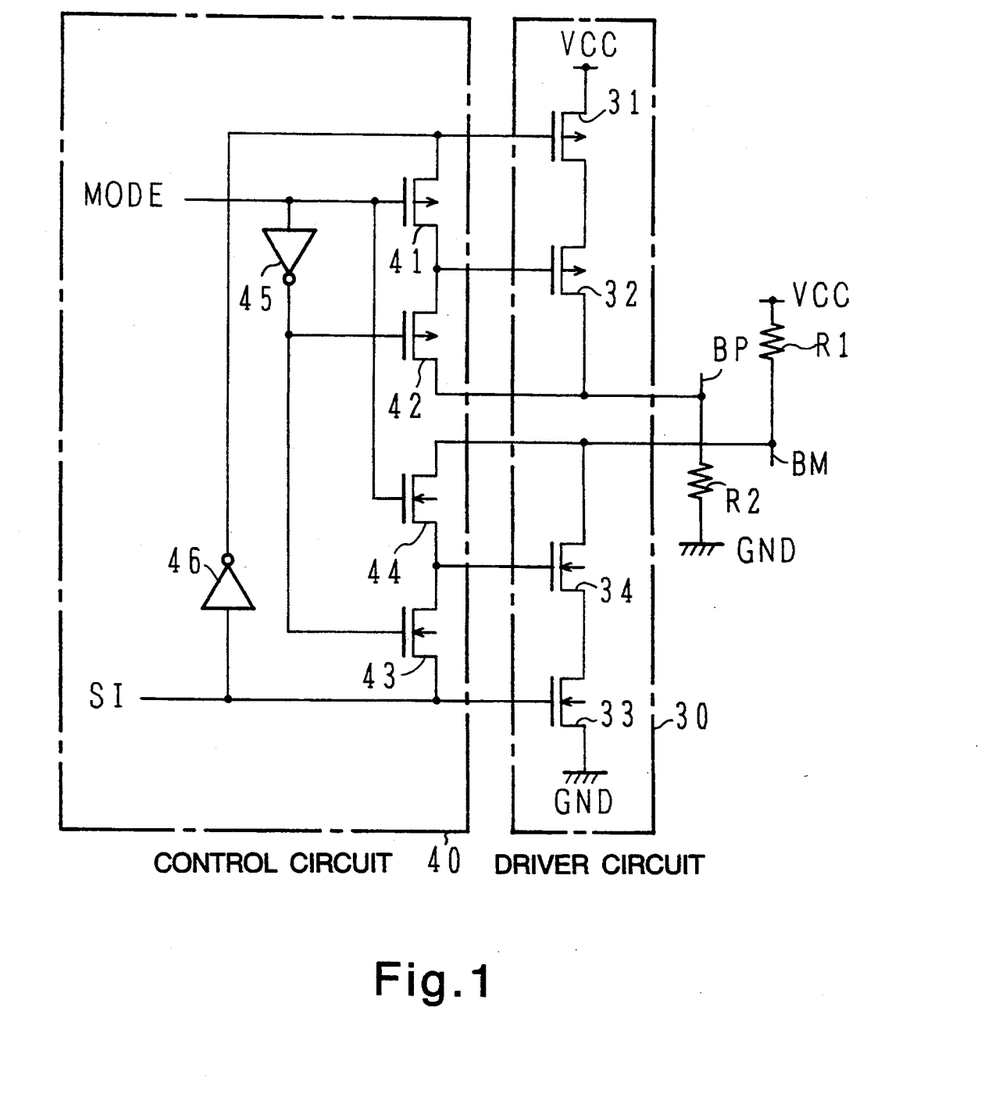
FIG. 1 is a diagram showing an output circuit for outputting signals having different logical amplitudes consisting of a driver circuit and an output stage of a control circuit in a semiconductor device according to a first embodiment of the present invention.

Conventionally, two sets of driver circuits are used for ordinary signal and wake-up signal, as shown in FIG. 7. In contrast, the present invention requires only one set of driver circuit, for example, as shown in FIG. 1, so that the number of the MOS transistors in the driver circuit is reduced to ⅔ from that in the conventional driver circuit. The chip area occupied by each MOS transistor in the driver circuit is, for example, about 100 times as large as that of a MOS transistor in the control circuit. Therefore, it is possible to remarkably reduce the area on the chip occupied by the driver circuit according to the present invention.

According to a second aspect of the present invention, there is provided an output circuit having first and second modes and comprising: a first switch for producing a first output signal at a first output terminal in accordance with data signal; a first circuit, connected between the first output terminal and a first power supply line in series with the first switch, working as a first level shifter during the first mode and working as a second switch responsive to the data signal during the second mode thereby an amplitude of the first output signal is varied in accordance with the first and second modes; a third switch for producing a second output signal at a second output terminal in accordance with the data signal; and a second circuit, connected between the second output terminal and a second power supply line in series with the third switch, working as a second level shifter during the first mode and working as a fourth switch responsive to the date signal during the second mode thereby an amplitude of the second output signal is varied in accordance with the first and second modes.

According to the third aspect of the present invention, there is provided a data communication system comprising: a plurality of electronic devices each of which includes an output circuit having first and second modes; and first and second communication lines connected to said electronic devices for transferring data therebetween; wherein said output circuit comprises; a first switch for producing a first output signal at a first output terminal, connected to the first communication line, in accordance with data signal, a first circuit, connected between the first output terminal and a first power supply line in series with the first switch, working as a first level shifter during the first mode and working as a second switch responsive to the data signal during the second mode thereby an amplitude of the first output signal is varied in accordance with the first and second modes, a third switch for producing a second output signal at a second output terminal, connected to the second communication line, in accordance with the data signal; and a second circuit, connected between the second output terminal and a second power supply line in series with the third switch, working as a second level shifter during the first mode and working as a fourth switch responsive to the date signal during the second mode thereby an amplitude of the second output signal is varied in accordance with the first and second modes.

Other features of the present invention will become apparent from the following description taken in connection with the accompanying drawings.

DESCRIPTION OF THE PREFERRED EMBODIMENTS

The present invention will be described in detail in connection with the following preferred embodiments.

First Embodiment

FIG. 1 is a diagram showing an output circuit for outputting signals having different logical amplitudes consisting of the driver circuit 30 and the output stage of the control circuit 40 in the semiconductor device according to a first embodiment of the present invention.

The driver circuit 30 includes pMOS transistors 31, 32 and nMOS transistors 33, 34. The pMOS transistor 31 is connected at its source to a power supply wire VCC, while the pMOS transistor 32 is connected at its source to the drain of the pMOS transistor 31. The drain of the pMOS transistor 32 forms one of the pair of output terminals. The source of the nMOS transistor 33 is connected to a grounding wire GND, while the source of the nMOS transistor 33 is connected to the drain of the nMOS transistor 33. The drain of the nMOS transistor 34 forms the other of the pair of output terminals.

The output stage of the control circuit 40 has pMOS transistors 41, 42 and nMOS transistors 43, 44. The source and drain of the pMOS transistor 41 are respectively connected to the gates of the pMOS transistors 31 and 32. The source and drain of the pMOS transistor 42 are respectively connected to the gate and drain of the pMOS transistor 32. The source and drain of the nMOS transistor 43 are respectively connected to the gates of the nMOS transistors 33 and 34. The source and drain of the nMOS transistor 44 are respectively connected to the gate and the drain of the nMOS transistor 34.

The gate of the pMOS transistor 41 is connected to the gate of the nMOS transistor 44, while the gate of the pMOS transistor 42 is connected to the gate of the nMOS transistor 43. The gate of the pMOS transistor 41 is connected through an inverter 45 to the both gates of the pMOS transistor 42 and nMOS transistor 43. The gate of the pMOS transistor 41 receives a mode signal MODE. The source of the nMOS transistor 43 is connected in one hand to the gate of the nMOS transistor 33 and on the other hand to the source of the pMOS transistor 41 through an inverter 46. The input signal SI is supplied to the input node of the inverter 46.

The operation of the first embodiment of the semiconductor device having the described construction is as follows.

Figure 2A:
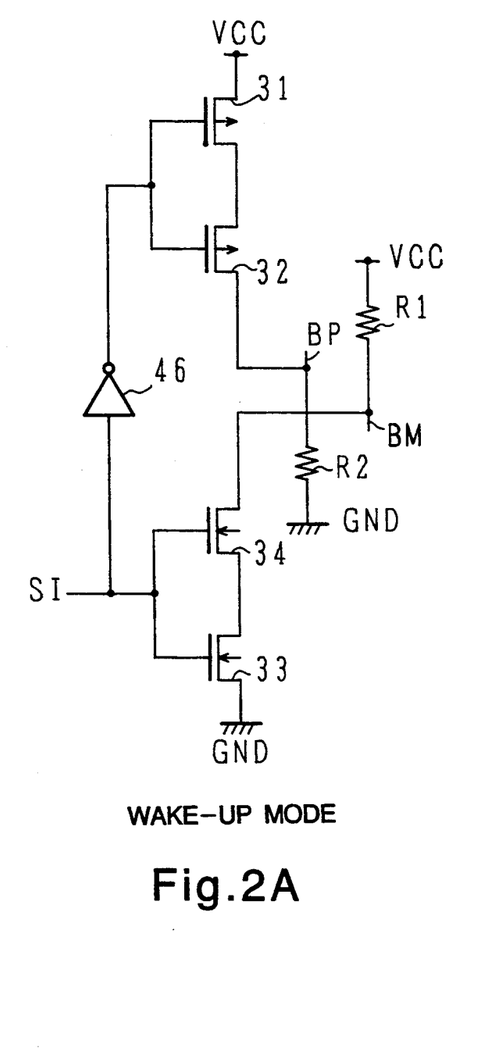
FIG. 2A is a circuit diagram which is equivalent to the circuit of FIG. 1 in a wake-up mode.

When transmitting a wake-up signal having a greater logical amplitude from the driver circuit 30, the mode signal MODE is set to a low level. In response to this, the pMOS transistor 41 and the nMOS transistor 43 turn on, while the pMOS transistor 42 and the nMOS transistor 44 turn off, whereby a circuit equivalent to that shown in FIG. 2A is formed.

In this circuit, when the input signal is shifted to a high level, the pMOS transistors 31 and 32 turn on and the potential of the signal transmission wire BP raises from the ground level to VCC{R2/(R2+Ronp1+Ronp2)}, where R2 is the resistance of pull-down resistor R2, and Ronp1 and Ronp2 are respectively the on-resistances of pMOS transistor 31 and pMOS transistor 32, and Ronp1/R2<<1 and Ronp2/R2<<1. While the nMOS transistors 33, 34 turn on and the potential of the signal transmission wire BM falls down from the power source voltage VCC to VCC{(Ronn3+Ronn4)/(R1+Ronn1+Ronn2)}, where R1 is the resistance of pull-up resistor R1, and Ronn3 and Ronn4 are respectively the on-resistances of the nMOS transistor 33 and nMOS transistor 34, and Ronn3/R1<<1 and Ronn4/R1<<1. Thus logical value '1' (dominant state) of the wake-up signal voltage between the signal transmission wires BP and BM is established. When the input signal is shifted to a low level, the pMOS transistors 31 and 32 turn off and the potential of the signal transmission wire BP falls down to ground level, while the nMOS transistors 33, 34 turn off and the potential of the signal transmission wire BM raises up to power source voltage VCC. Thus logical value '0' (passive state) of negative voltage −VCC between the signal transmission wires BP and BM is established.

Figure 2B:
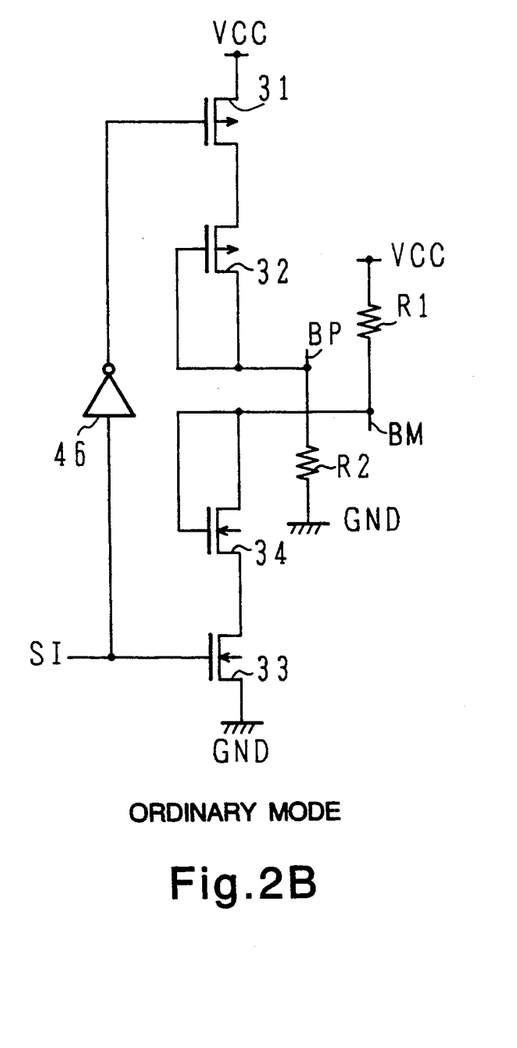
FIG. 2B is a circuit diagram which is equivalent to the circuit of FIG. 1 in a ordinary mode.

When transmitting an ordinary signal having smaller logical amplitude from the driver circuit 30, referring again to FIG. 1, the mode signal MODE is set to the high level. In response to this, the pMOS transistor 41 and the nMOS transistor 43 turn off, while the pMOS transistor 42 and the nMOS transistor 44 turn on, whereby a circuit equivalent to that shown in FIG. 2B is formed. In this circuit, the pMOS transistor 32 and the nMOS transistor 34 function as load elements or level shifters. In this circuit, when the input signal SI is shifted to high level, the pMOS transistor 31 turns on and the potential of the signal transmission wire BP raises from the ground level to (VCC−Vthp){R2/(R2+Ronp1)}, where Vthp is the threshold voltage of the pMOS transistor 32. While the nMOS transistor 33 turns on and the potential of the signal transmission wire BM falls down from the source voltage VCC to Vthn+(VCC−Vthn).{R1/(R1+Ronn3)}, where Vthn is the threshold voltage of the nMOS transistor 34. Thus a logical value '1' (dominant state) of ordinary signal voltage between the signal transmission wires BP and BM is established. When the input signal SI is shifted to the low level, the pMOS transistor 31 turns off and the potential of the signal transmission wire BP falls down to ground level, while the nMOS transistor 33 turns off and the potential of the signal transmission wire BM raises up to the level of the power supply voltage VCC. Thus logical value '0' (passive state) of negative voltage −VCC between the signal transmission wires BP and BM is established.

Conventionally, two sets of driver circuits 12 and 13 in FIG. 7 are used for ordinary signals and wake-up signals. In contrast, the described first embodiment requires only one set of driver circuit 30 in FIG. 1, so that the number of the MOS transistors in driver circuit circuit 30 is reduced to 2/3 from that in the conventional driver circuits 12 and 13. The chip area occupied by each MOS transistor in the driver circuit 30 is about 100 times as large as that of a MOS transistor in the control circuit 40. Therefore, it is possible to remarkably reduce the area on the chip occupied by the driver circuit 30.

Second Embodiment

Figure 3:
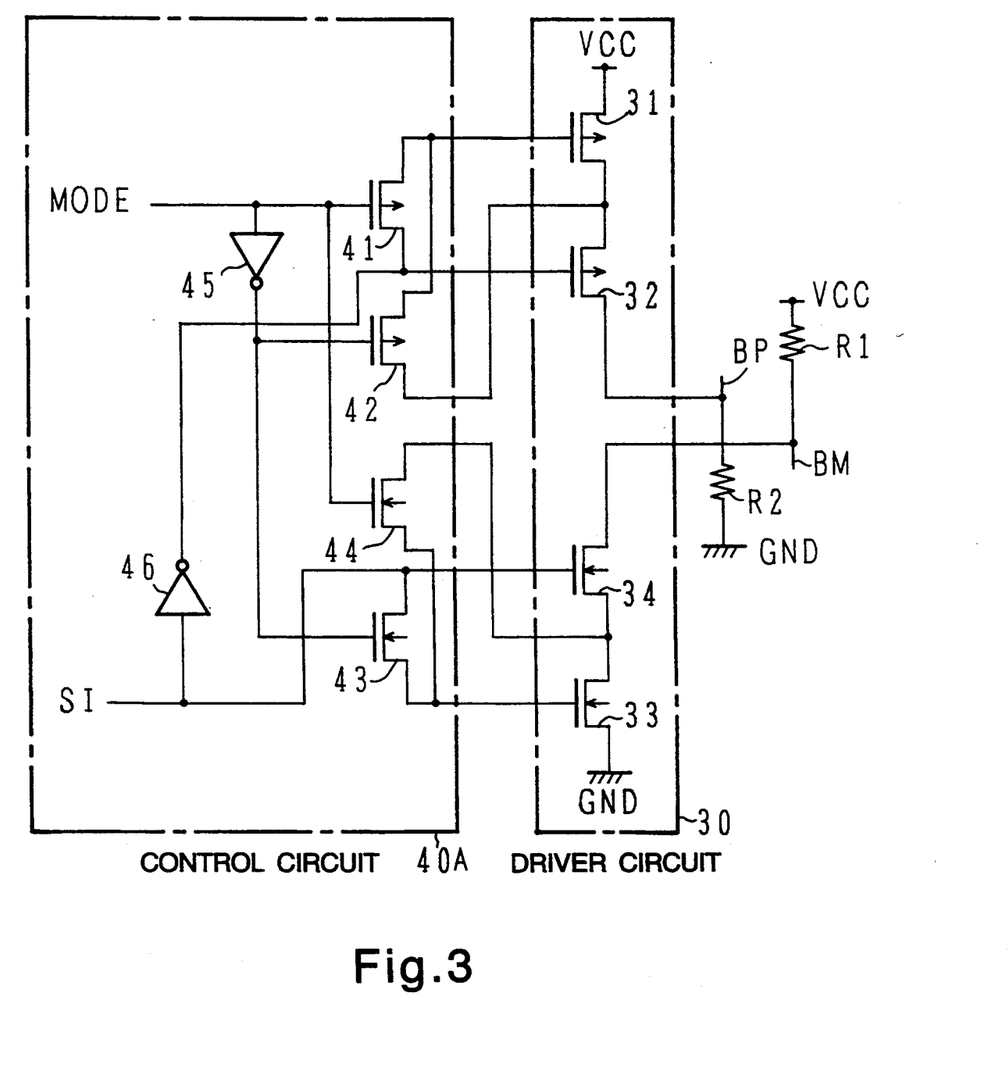
FIG. 3 is a diagram showing an output circuit for outputting signals having different logical amplitudes consisting of a driver circuit and an output stage of a control circuit in a semiconductor device of a second embodiment of the present invention.

FIG. 3 is the diagram showing the output circuit for outputting signals having different logical amplitudes consisting of the driver circuit 30 and the output stage of the control circuit 40A in the semiconductor device of the second embodiment in accordance with the present invention.

When transmitting an ordinary signal having smaller logical amplitude from the driver circuit 30 in the above-described first embodiment shown in FIG. 1, the pMOS transistor 32 and the nMOS transistor 34 function as the load elements or level shifters, while in the second embodiment shown in FIG. 2, the pMOS transistor 31 and the nMOS transistor 33 function as the load elements or level shifters.

More specifically, the source and the drain of the pMOS transistor 42 are respectively connected to the gate and the drain of the pMOS transistor 31, and the source and drain of the nMOS transistor 44 are respectively connected to the gate and the drain of the nMOS transistor 33. The output end of the inverter 46 is connected to the gate of the pMOS transistor 32. A signal wire for the input signal SI is connected to the gate of the nMOS transistor 34.

Other portions of the second embodiment are the same as those in the first embodiment. The operation of the second embodiment is omitted because of being obvious from the first embodiment described above. This embodiment produces the same effect as the first embodiment described above.

Third Embodiment

Figure 4:
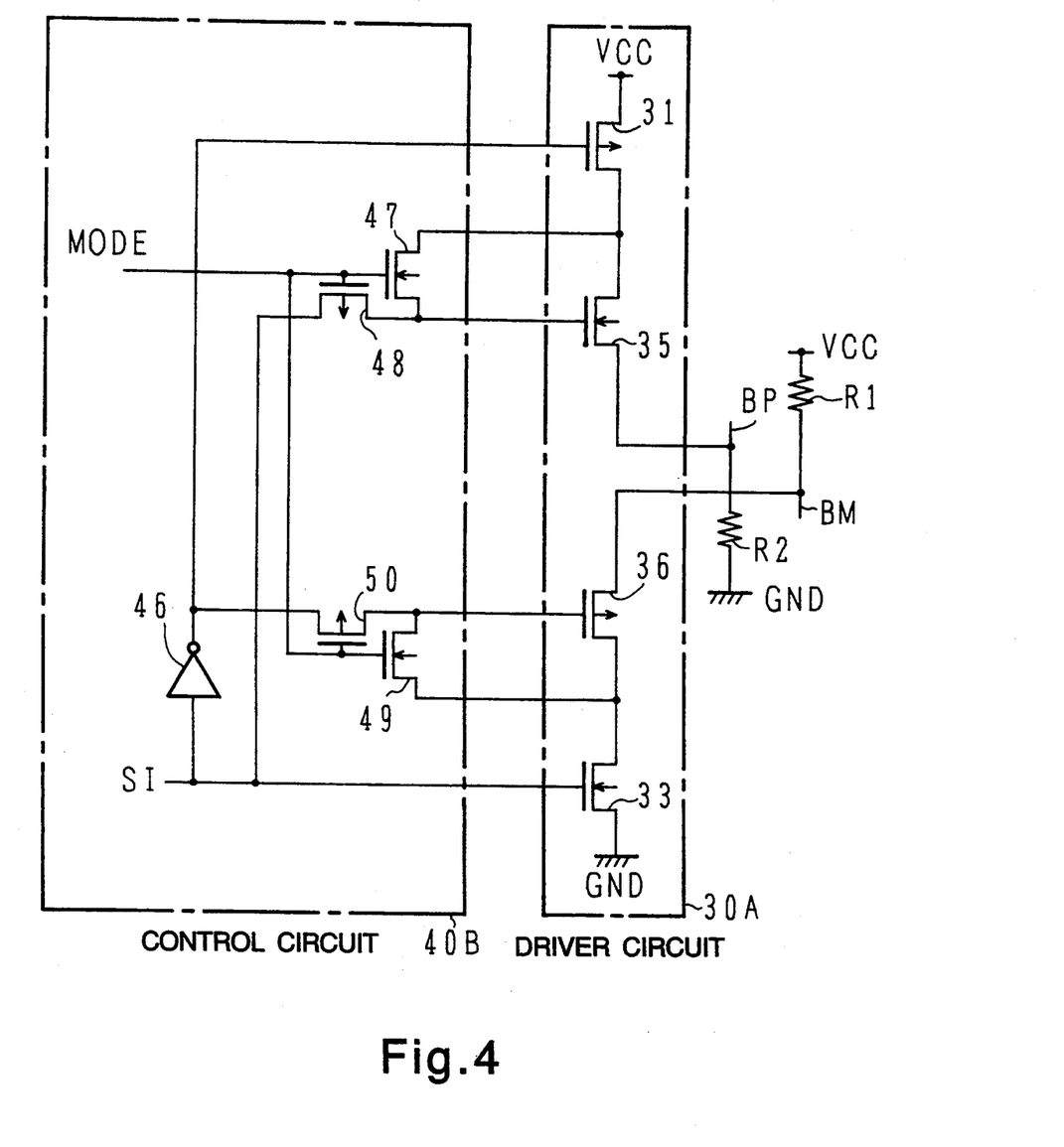
FIG. 4 is a diagram showing an output circuit for outputting signals having different logical amplitudes consisting of a driver circuit and an output stage of a control circuit in a semiconductor device of a third embodiment of the present invention.

FIG. 4 is the diagram showing the output circuit for outputting signals having different logical amplitudes consisting of the driver circuit 30A and the output stage of the control circuit 40B in the semiconductor device according to the third embodiment of the present invention.

In this driver circuit 30A, the source of the pMOS transistor 31 is connected to the power supply wire VCC, and the drain of the nMOS transistor 35 is connected to the drain of the pMOS transistor 31. The source of the nMOS transistor 35 is connected to one of the pair of output terminals. The source of the nMOS transistor 33 is connected to the grounding wire GND, and the drain of the pMOS transistor 36 is connected to the drain of the nMOS transistor 33. The source of the pMOS transistor 36 is connected to the other output terminal of the pair.

The output stage of the control circuit 40B have an inverter 46, nMOS transistors 47, 49 and pMOS transistors 48, 50. The source and drain of the nMOS transistor 47 are respectively connected to the gate and drain of the nMOS transistor 35. The drain of the pMOS transistor 48 is connected to the gate of the nMOS transistor 35. The source and drain of the nMOS transistor 49 are respectively connected to the drain and gate of the pMOS transistor 36. The drain of the pMOS transistor 50 is connected to the gate of the pMOS transistor 36.

The gate of the nMOS transistor 47 is connected to the gates of the pMOS transistor 48, nMOS transistor 49 and the pMOS transistor 50, and these gates receive the mode signal MODE. The input end of the inverter 46 is connected to the gate of the nMOS transistor 33 and also to the source of the pMOS transistor 48. The output end of the inverter 46 is connected to the gate of the pMOS transistor 31 and also to the source of the pMOS transistor 50. The input signal SI is supplied to the input end of the inverter 46.

The operation of the third embodiment of the semiconductor device having the described construction is as follows.

When transmitting a wake-up signal having larger logical amplitude from the driver circuit 30A, the mode signal MODE is set to low level. In response to this, the pMOS transistors 48, 50 turn on, while the nMOS transistors 47, 49 turn off. In this case, when the input signal SI is shifted to the high level, the pMOS transistor 31 and the nMOS transistor 35 turn on and the potential of the signal transmission wire BP raises from ground level to $VCC\{R2/(R2+Ronp1+Ronn5)\}$, where Ronn5 is the on-resistance of nMOS transistor 35 and $Ronn5/R2 \ll 1$. While the nMOS transistor 33 and the pMOS transistor 36 turn on and the potential of the signal transmission wire BM falls down from the power source voltage VCC to $VCC\{(Ronn3+Ronp6)/(R1+Ronn3+Ronp6)\}$, where Ronp6 is on-resistance of the pMOS transistor 36 and $Ronp6/R1 \ll 1$. Thus logical value '1' (dominant state) of the wake-up signal voltage between the signal transmission wires BP and BM is established. When the input signal SI is shifted to a low level, the pMOS transistor 31 and the nMOS transistor 35 turn off and the potential of the signal transmission wire BP falls down to ground level, while the nMOS transistor 33 and the pMOS transistor 36 turn off and the potential of the signal transmission wire BM raises up to the power source voltage VCC. Thus logical value '0' (passive state) of negative voltage $-VCC$ between the signal transmission wires BP and BM is established.

When transmitting an ordinary signal having a smaller logical amplitude from the driver circuit 30A, the mode signal MODE is set to a high level. In response to this, the pMOS transistors 48, 50 turn off, while the nMOS transistors 47, 49 turn on. In this case, the nMOS transistor 35 and the pMOS transistor 36 function as load elements or level shifters.

In this state, when the input signal SI is shifted to high level, the pMOS transistor 31 turns on and the potential of the signal transmission wire BP raises from ground level to $(VCC-Vthn)\{R2/(R2+Ronp1)\}$, where Vthn is threshold voltage of the nMOS transistor 35. While the nMOS transistor 33 turns on and the potential of the signal transmission wire BM falls down from the source voltage VCC to $Vthp+(VCC-Vthp)\{R1/(R1+Ronn3)\}$, where Vthp is the threshold voltage of the pMOS transistor 36. Thus a logical value '1' (dominant state) of ordinary signal voltage between the signal transmission wires BP and BM is established.

When the input signal SI is shifted to a low level, the pMOS transistor 31 turns off and the potential of the signal transmission wire BP falls down to ground level, while the nMOS transistor 33 turns off and the potential of the signal transmission wire BM raises up to the power source voltage VCC. Thus logical value '0' (passive state) of negative voltage $-VCC$ between the signal transmission wires BP and BM is established.

The third embodiment produces the same effect as the first embodiment described above.

Fourth Embodiment

Figure 5:
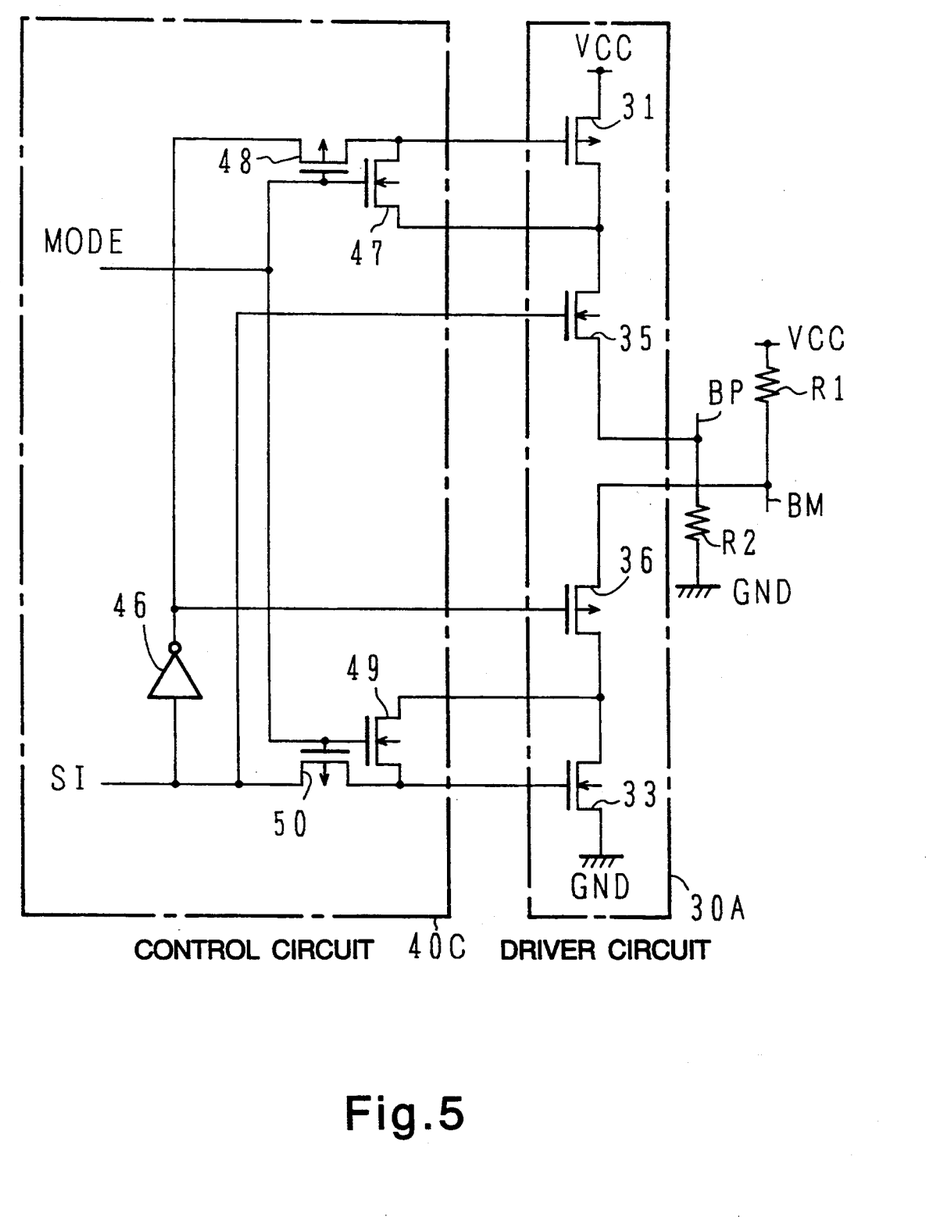
FIG. 5 is a diagram showing an output circuit for outputting signals having different logical amplitudes consisting of the driver circuit and an output stage of a control circuit in a semiconductor device of a fourth embodiment of the present invention.

FIG. 5 is a diagram showing the output circuit for outputting signals having different logical amplitudes consisting of the driver circuit 30A and the output stage of the control circuit 40C in the semiconductor device according to the fourth embodiment of the present invention.

When transmitting an ordinary signal having smaller logical amplitude from the driver circuit 30A in the third embodiment described above in connection with FIG. 4, the nMOS transistor 35 and the pMOS transistor 36 function as load elements or level shifters, while in the fourth embodiment shown in FIG. 5, the pMOS transistor 31 and the nMOS transistor 33 function as load elements or level shifters. More specifically, the drain and source of the nMOS transistor 47 are respectively connected to the gate and drain of the pMOS transistor 31, and the source and drain of the nMOS transistor 49 are respectively connected to the gate and drain of the nMOS transistor 33. The output end of the inverter 46 is connected through the pMOS transistor 48 to the gate of the pMOS transistor 31. A signal wire for the input signal SI is connected through a pMOS transistor 50 to the gate of the nMOS transistor 33. The gates of the MOS transistors 47 to 50 are connected in common and receive the mode signal MODE.

Other portions of the fourth embodiment are the same as those of the third embodiment. The operation of the fourth embodiment is omitted because of being obvious from the third embodiment described above. This embodiment produces the same effect as the first embodiment described above.

Having described specific embodiments of the present invention, it is to be understood that modification and variation of the invention are possible without departing from the spirit and scope thereof.

What is claimed is:

1. An output circuit for outputting signals having different logical voltage amplitudes between a first output terminal and a second output terminal, comprising:
    a driving circuit having first and second MOS transistors connected in series between a first power supply line and the first output terminal; and third and fourth MOS transistors connected in series between a second power supply line and the second output terminal; and
    a control circuit for turning on/off said first to fourth MOS transistors in common in response to an input signal of binary logic when a mode signal is one state of binary logic and for turning on/off both of said first and third MOS transistors in common with short-circuiting between a gate and a drain of each said second and fourth MOS transistor in response to said input signal when said mode signal is the other state of the binary logic.

2. An output circuit according to claim 1, wherein each of said first and second MOS transistor is of p-channel type and each of said third and fourth MOS transistor is of n-channel type.

3. An output circuit according to claim 2, wherein said control circuit comprises:
    a first switching means connected between gates of said first and second MOS transistors;
    a second switching means connected between said gate of said second MOS transistor and a drain of said second MOS transistor;
    a third switching means connected between gates of said third and fourth MOS transistors;
    a fourth switching means connected between said gate of said fourth MOS transistor and a drain of said fourth MOS transistor;
    a first circuit for turning on said first and third switching means and turning off said second and fourth switching means in response to said mode signal being said one state and for turning off said first and third switching means and turning on said second and fourth switching means in response to said mode signal being said other state; and
    a second circuit for supplying voltage of one state of binary logic to said gate of said first MOS transistor and voltage of the other state of binary logic to said gate of said third MOS transistor in response to said input signal.

4. An output circuit according to claim 3, wherein each said first and second switching means is a MOS transistor of p-channel type and each said third and fourth switching means is a MOS transistor of n-channel type.

5. An output circuit according to claim 2, wherein said control circuit comprises:
    a first switching means connected between gates of said first and second MOS transistors;
    a second switching means connected between said gate of said first MOS transistor and a drain of said first MOS transistor;
    a third switching means connected between gates of said third and fourth MOS transistors;
    a fourth switching means connected between said gate of said third MOS transistor and a drain of said third MOS transistor;
    a first circuit for turning on said first and third switching means and turning off said second and fourth switching means in response to said mode signal being said one state and for turning off said first and third switching means and turning on said second and fourth switching means in response to said mode signal being said other state; and
    a second circuit for supplying voltage of one state of binary logic to said gate of said second MOS transistor and voltage of the other state of binary logic to said gate of said fourth MOS transistor in response to said input signal.

6. An output circuit according to claim 5, wherein each said first and second switching means is a MOS transistor of p-channel type and each said third and fourth switching means is a MOS transistor of n-channel type.

7. An output circuit according to claim 1, wherein each of said first and fourth MOS transistor is of p-channel type and each of said second and third MOS transistor is of n-channel type.

8. An output circuit according to claim 7, wherein said control circuit comprises:
    a first switching means connected between a gate of said second MOS transistor and a first signal line in which said input signal is transmitted;
    a second switching means connected between said gate of said second MOS transistor and a drain of said second MOS transistor;
    a third switching means connected between a gate of said fourth MOS transistor and a second signal line in which an inverse signal to said input signal is transmitted;
    a fourth switching means connected between said gate of said fourth MOS transistor and a drain of said fourth MOS transistor;
    a first circuit for turning on said first and third switching means and turning off said second and fourth switching means in response to said mode signal being said one state and for turning off said first and third switching means and turning on said second and fourth switching means in response to said mode signal being said other state; and a second circuit for supplying voltage of one state of binary logic to said first signal line and a gate of said third MOS transistor and voltage of the other state of binary logic to said second signal line and a gate of said first MOS transistor in response to said input signal.

9. An output circuit according to claim 8, wherein each said first and third switching means is a MOS transistor of p-channel type and each said second and fourth switching means is a MOS transistor of n-channel type.

10. An output circuit according to claim 7, wherein said control circuit comprises:

a first switching means connected between a gate of said first MOS transistor and a first signal line in which said input signal is transmitted;

a second switching means connected between said gate of said first MOS transistor and a drain of said first MOS transistor;

a third switching means connected between a gate of said third MOS transistor and a second signal line in which an inverse signal to said input signal is transmitted;

a fourth switching means connected between said gate of said third MOS transistor and a drain of said third MOS transistor;

a first circuit for turning on said first and third switching means and turning off said second and fourth switching means in response to said mode signal being said one state and for turning off said first and third switching means and turning on said second and fourth switching means in response to said mode signal being said other state; and a second circuit for supplying voltage of one state of binary logic to said first signal line and a gate of said fourth MOS transistor and voltage of the other state of binary logic to said second signal line and a gate of said second MOS transistor in response to said input signal.

11. An output circuit according to claim 10, wherein each said first and third switching means is a MOS transistor of p-channel type and each said second and fourth switching means is a MOS transistor of n-channel type.

12. An output circuit having first and second modes and comprising:

a first switch for producing a first output signal at a first output terminal in accordance with a data signal;

a first circuit, connected between the first output terminal and a first power supply line in series with the first switch, working as a first level shifter during the first mode and working as a second switch responsive to the data signal during the second mode thereby varying an amplitude of the first output signal in accordance with the first and second modes;

a third switch for producing a second output signal at a second output terminal in accordance with the data signal; and a second circuit, connected between the second output terminal and a second power supply line in series with the third switch, working as a second level shifter during the first mode and working as a fourth switch responsive to the date signal during the second mode thereby varying an amplitude of the second output signal in accordance with the first and second modes.

13. A data communication system comprising:

a plurality of electronic devices each of which includes an output circuit having first and second modes; and first and second communication lines connected to said electronic devices for transferring data therebetween;

wherein said output circuit comprises, a first switch for producing a first output signal at a first output terminal, connected to the first communication line, in accordance with a data signal, a first circuit, connected between the first output terminal and a first power supply line in series with the first switch, working as a first level shifter during the first mode and working as a second switch responsive to the data signal during the second mode thereby varying an amplitude of the first output signal in accordance with the first and second modes, a third switch for producing a second output signal at a second output terminal, connected to the second communication line, in accordance with the data signal; and a second circuit, connected between the second output terminal and a second power supply line in series with the third switch, working as a second level shifter during the first mode and working as a fourth switch responsive to the date signal during the second mode thereby varying an amplitude of the second output signal in accordance with the first and second modes.

* * * * *